United States Patent
Kwon

(10) Patent No.: US 10,505,390 B2
(45) Date of Patent: Dec. 10, 2019

(54) POWER BLACKOUT SENSING SYSTEM WITH A PHANTOM VOLTAGE DETECTOR INCLUDING A COUPLED INDUCTOR DEVICE

(71) Applicant: Ig Soo Kwon, San Ramon, CA (US)

(72) Inventor: Ig Soo Kwon, San Ramon, CA (US)

( * ) Notice: Subject to any disclaimer, the term of this patent is extended or adjusted under 35 U.S.C. 154(b) by 110 days.

(21) Appl. No.: 15/912,429

(22) Filed: Mar. 5, 2018

(65) Prior Publication Data

US 2019/0273390 A1 Sep. 5, 2019

(51) Int. Cl.
| | |
|---|---|
| H02J 9/06 | (2006.01) |
| H02M 7/06 | (2006.01) |
| G01R 1/30 | (2006.01) |
| G01R 19/165 | (2006.01) |
| G01R 19/155 | (2006.01) |
| G05F 1/652 | (2006.01) |
| G01R 21/00 | (2006.01) |
| G01R 31/42 | (2006.01) |

(52) U.S. Cl.
CPC ............ *H02J 9/061* (2013.01); *G01R 1/30* (2013.01); *G01R 19/155* (2013.01); *G01R 19/16547* (2013.01); *G05F 1/652* (2013.01); *H02M 7/06* (2013.01); *G01R 21/003* (2013.01); *G01R 31/42* (2013.01)

(58) Field of Classification Search
None
See application file for complete search history.

(56) References Cited

U.S. PATENT DOCUMENTS

| | | | |
|---|---|---|---|
| 2014/0183959 A1* | 7/2014 | Kabasawa | H02J 9/061 307/66 |
| 2015/0229160 A1* | 8/2015 | Kawakami | H02M 3/156 307/64 |
| 2015/0288223 A1 | 10/2015 | Sato et al. | |

FOREIGN PATENT DOCUMENTS

EP 2910957 A1 8/2015

* cited by examiner

*Primary Examiner* — Jared Fureman
*Assistant Examiner* — Aqeel H Bukhari
(74) *Attorney, Agent, or Firm* — Innovation Counsel LLP

(57) ABSTRACT

A power blackout sensing system includes: a voltage regulator configured to receive one of three phase wires and a neutral wire of a primary power source that provides an alternating current (AC) power; a sensing block configured to receive the neutral wire of the primary power source and comprising a coupled inductor device and a voltage sense amplifier; and a secondary power source. The voltage regulator is coupled to a switch and generates a direct current (DC) voltage signal. The coupled inductor device of the sensing block comprises a pull-down resistor, wherein the coupled inductor device is configured to convert a voltage signal of the neutral wire to a 180-degree phase-shifted voltage signal of the neutral wire and generate a reference voltage signal using the pull-down resistor. The voltage sense amplifier is configured to amplify a voltage gap between the 180-degree phase-shifted voltage signal of the neutral wire and the reference voltage signal. The sensing block detects a phantom voltage on the one of three phase wires and provides an output signal corresponding the secondary power source during a blackout period.

16 Claims, 8 Drawing Sheets

POWER BLACKOUT SENSING SYSTEM WITH A PHANTOM VOLTAGE DETECTOR INCLUDING A COUPLED INDUCTOR DEVICE

TECHNICAL FIELD

The present disclosure relates generally to a power blackout sensing system, more particularly, to a power blackout sensing system including a phantom voltage detector.

BACKGROUND

In general, a live power is required for an emergency power surge detector or an emergency light to operate in a power shutdown condition. For residential or commercial applications, a power utility construction is required to implement an emergency lighting system to power it by a live power, which can be not only time consuming but also costly. Moreover, such an emergency lighting system that relies on a live power supply may not work in a power blackout condition because the live power supply to the emergency lighting system may be completely cut off in the power blackout condition.

SUMMARY

According to one embodiment, a power blackout sensing system includes: a voltage regulator configured to receive one of three phase wires and a neutral wire of a primary power source that provides an alternating current (AC) power; a sensing block configured to receive the neutral wire of the primary power source and comprising a coupled inductor device and a voltage sense amplifier; and a secondary power source. The voltage regulator is coupled to a switch and generates a direct current (DC) voltage signal. The coupled inductor device of the sensing block comprises a pull-down resistor, wherein the coupled inductor device is configured to convert a voltage signal of the neutral wire to a 180-degree phase-shifted voltage signal of the neutral wire and generate a reference voltage signal using the pull-down resistor. The voltage sense amplifier is configured to amplify a voltage gap between the 180-degree phase-shifted voltage signal of the neutral wire and the reference voltage signal. The sensing block detects a phantom voltage on the one of three phase wires and provides an output signal corresponding the secondary power source during a blackout period.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the preferred embodiment given below serve to explain and teach the principles described herein.

Figure 1:
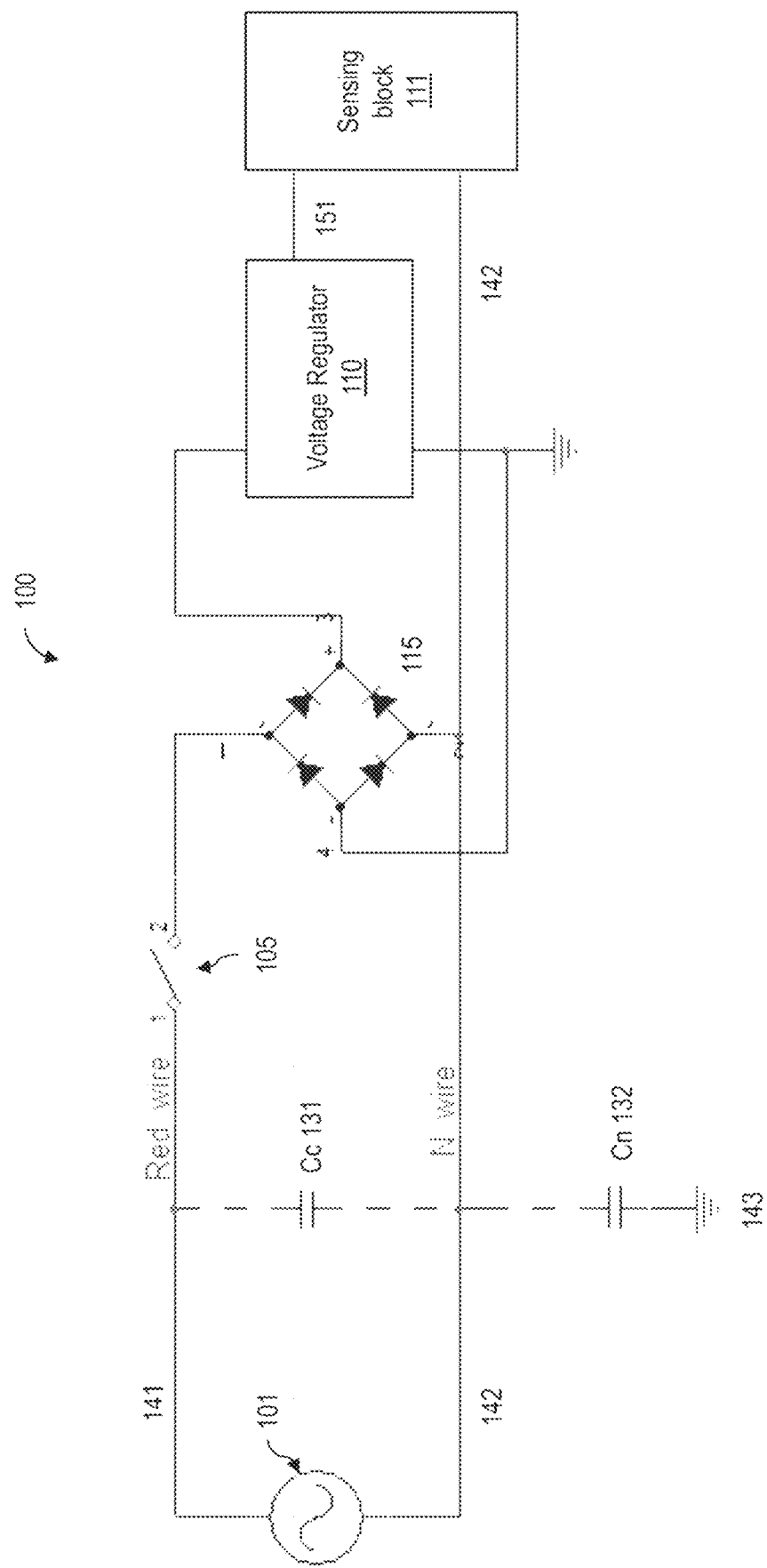
FIG. 1 shows a block diagram of an example power blackout sensing system, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a power blackout sensing system including a phantom voltage detector. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed above in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure describes a power blackout sensing system. The present power blackout sensing system includes a secondary power source (e.g., a battery) and a phantom voltage detector and can be coupled to an external device or system. According to one embodiment, the external device is a light emitting diode (LED) light. The phantom voltage detector can differentiate a switch on/off condition from a power blackout condition. In a power blackout condition, the phantom voltage detector generates a signal to supply a secondary power to the coupled device or system until the main power to the system is restored.

The present power blackout sensing system can reduce or eliminate a need for constructing power utility (e.g., wiring to a permanent live power supply or a secondary power supply) to build an emergency lighting system. Therefore, the cost, time, and effort for implementing an emergency lighting system can be saved. Other applicable examples of the present power blackout sensing system include, but are not limited to, medical equipment and high-precision machines that require a seamless operation even in a power blackout condition.

According to another embodiment, an LED light integrates the present power blackout sensing system including a battery and a phantom voltage detector. The LED light can detect a power blackout condition using the integrated phantom voltage detector. The LED light can be used as an emergency light in a complete power blackout condition.

FIG. 1 shows a block diagram of an example power blackout sensing system, according to one embodiment. The power blackout sensing system 100 includes an AC power source 101, a switch 105, a rectifier 115, a voltage regulator 110, and a sensing block 111.

According to one embodiment, the AC power source 101 is a three-phase AC power source including three wires (e.g., black, red, and white wires) and a neutral wire 142 (e.g., a bare copper wire). Among the three wires, two wires (e.g., a red wire 141 and the neutral wire 142) can be connected to the sensing block 111 that can detect a phantom voltage. The voltage regulator 110 receives rectified signals from the rectifier 115 and generates a direct voltage (DC) signal 151. The voltage signal 151 and the neutral wire 142 are connected to the sensing block 111. The present example will be described for an exemplary case where the red and neutral wires are connected to the sensing block 111; however, it is noted that any other two wires can be connected to the sensing block without deviating from the scope of the present disclosure.

In the present example, the neutral wire 142 is always connected to the sensing block 111 while the red wire 141 is connected to the switch 105. Parasitic capacitances exist between the red wire 141 and the neutral wire 142, and between the neutral wire 142 and the ground 143, respectively. The parasitic capacitor Cc 131 represents a parasitic capacitor between the red wire 141 and the neutral wire 142, and the parasitic capacitor Cn 132 represent a parasitic capacitor between the neutral wire 142 and the ground 143.

During a normal power-on condition, the AC power source 101 exhibits three phases including a first phase between the black wire and the neutral wire 142 (e.g., AC 100V), a second phase between the red wire 141 and the neutral 142 (e.g., AC 100V), and a third phase between the black wire and the red wire 141 (e.g., AC 200V).

When the switch is off, a phantom voltage V_phantom that is biased to the neutral wire 142 can be expressed as:

$$V\_phantom = V\_redwire*(Cc)/(Cn+Cc) \quad (\text{Eq. 1})$$

Herein, the phantom voltage V_phantom can be small because the parasitic capacitor Cc is relatively small compared to the parasitic capacitor Cn. In a case where the amount of charges stored in the parasitic capacitors is small, the parasitic capacitors cannot be used a secondary power source.

For example, if the parasitic capacitance values are the same, i.e., Cc=Cn, the phantom voltage can be expressed as:

$$V\_phantom = 0.5*V\_redwire.$$

When the switch 105 is off, the neutral wire 142 exhibits the phantom voltage, and the red wire 141 exhibits 0 volt. When the power is off (e.g., in a blackout condition), both the neutral and red wires exhibit 0 volt.

Figure 2:
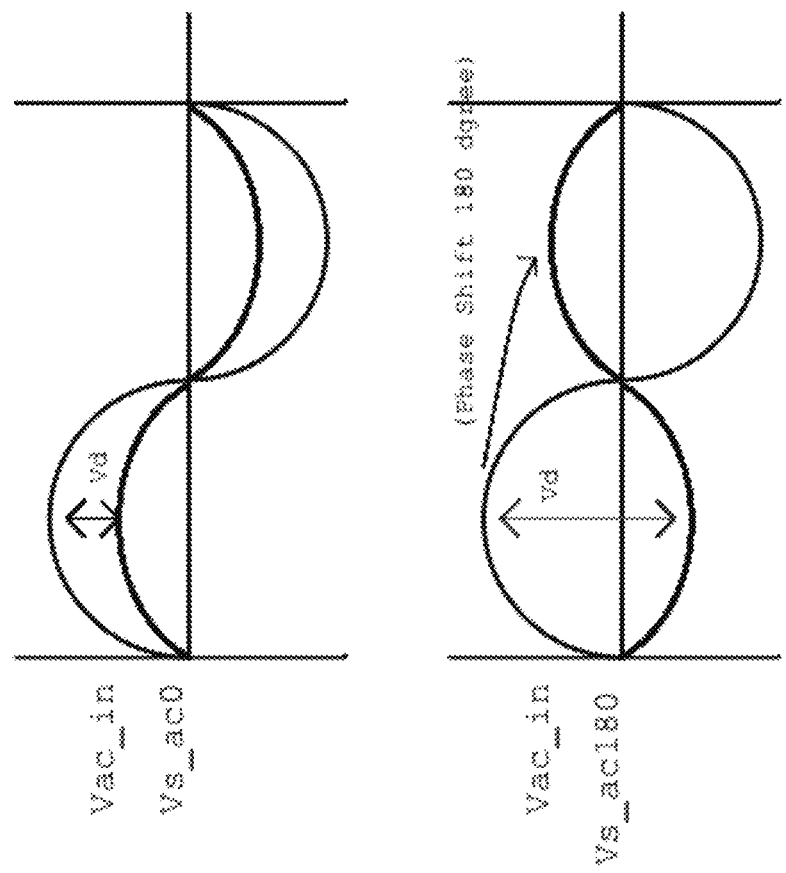
FIG. 2 shows output phase shift waveforms of example voltage transformers, according to one embodiment.
Figure 2:
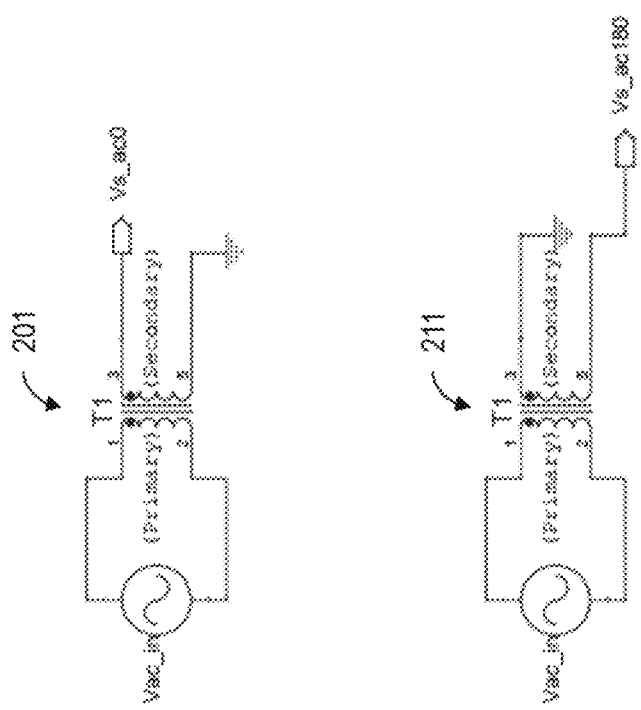

FIG. 2 shows output phase shift waveforms of example voltage transformers, according to one embodiment. A voltage transformer transforms an AC input voltage signal (Vac_in) that is output from an AC power source and generates an AC output voltage signal (Vs_ac). The amplitude of the AC output voltage signal can be different from that of the AC input voltage signal. For example, the amplitude of the AC output voltage signal is smaller than that of the AC input voltage signal. The first voltage transformer 201 generates an AC output voltage Vs_ac0 with no phase shift from the AC input voltage signal Vac_in. The second voltage transformer 211 generates an AC output voltage Vs_ac180 with a 180-degree phase shift from the AC input voltage signal Vac_in. Due to the 180-degree phase shift, the voltage different between the AC output voltage signal Vs_ac180 and the AC input voltage signal Vac_in of the voltage transformer 211 is greater than voltage different between the AC output voltage signal Vs_ac0 and the AC input voltage signal Vac_in of the voltage transformer 201. In the following examples, a voltage transformer is used for the convenience of explanation; however, it is noted that the voltage transformer can be replaced with other types of coupled inductor devices such as a choke coil.

Figure 3:
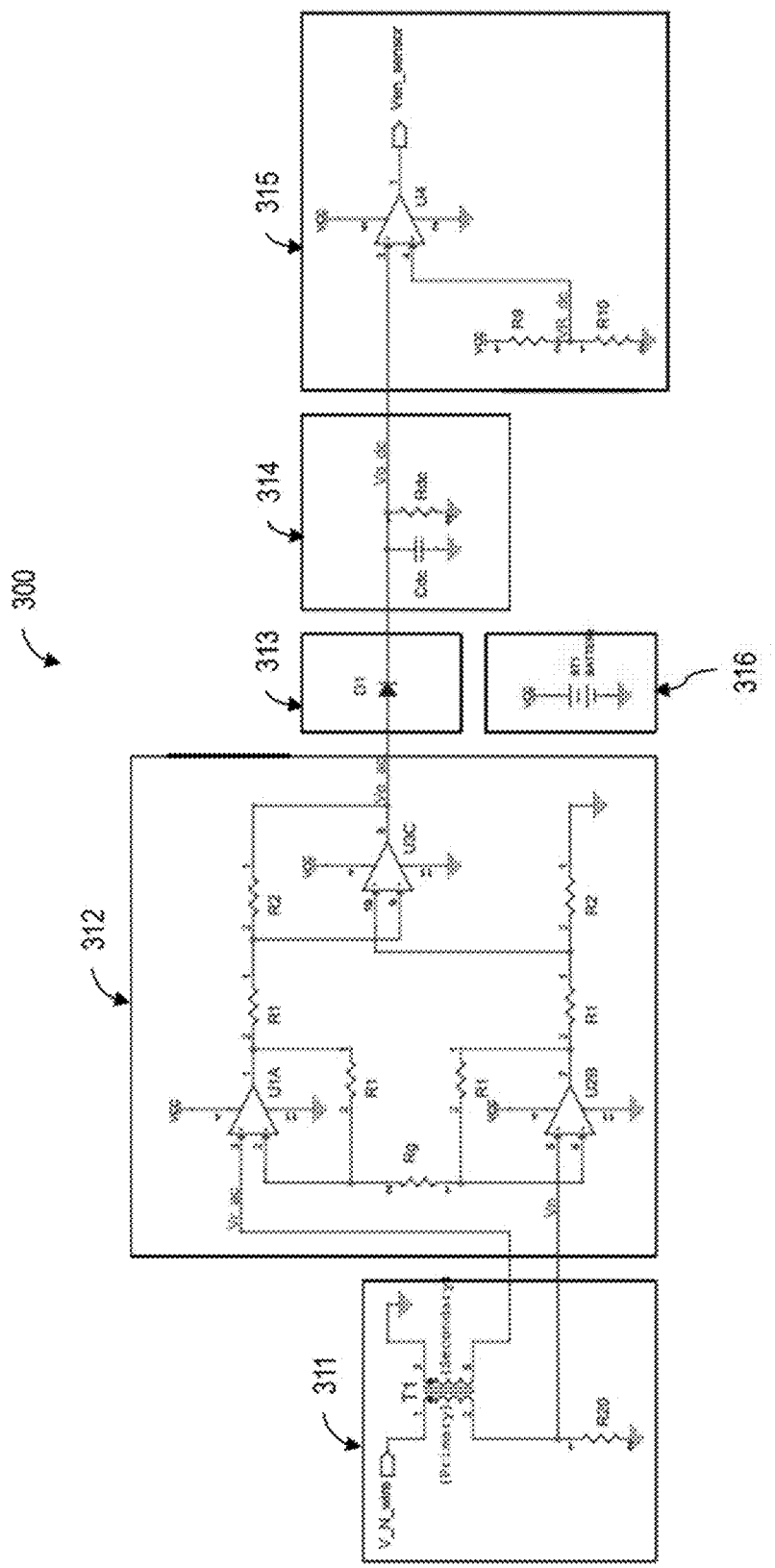
FIG. 3 shows an example power blackout sensing system including a secondary power source, according to one embodiment.

FIG. 3 shows an example power blackout sensing system including a secondary power source, according to one embodiment. A power blackout sensing system 300 includes a voltage converter transformer 311 (or a choke coil) with a 180-degree phase shift, a voltage sense amplifier 312, a DC clamp 313, a AC-to-DC converter (ADC) 314, a voltage comparator 315, and a battery 316. The power blackout sensing system 300 may correspond to the sensing block 111 of FIG. 1.

According to one embodiment, the reference voltage signal Via is generated using the voltage signal V_N_wire on the neutral wire. For example, the voltage converter transformer 311 that phases shift (by 180 degrees) the voltage V_N_wire also generates the reference voltage signal Vn. In this case, a voltage gap between the voltage V_N_wire and the AC reference voltage Vr_ac that is output from the voltage converter transformer 311 becomes 2*(V_N_wire)*ratio (wherein ratio is a transform ratio of the voltage transformer T1). The voltage gap between the voltage V_N_wire and the reference voltage signal Vn can be amplified using the ratio of the voltage transformer T1 other than 1.

The voltage converter transformer 311 includes a voltage transformer T1 (e.g., the voltage transformer 211 of FIG. 2) and a pull-down resistor R20. The voltage converter transformer 311 generates two signals including a 180-degree phase shifted transformed voltage signal Vr_ac and a reference voltage signal Vn using the voltage V_N_wire on the neutral wire. The reference voltage signal Vn can be approximated as the voltage signal V_N_wire on the neutral wire (e.g., the neutral wire 142 of FIG. 1) because the pull-down resistor R20 is much greater than the internal resistance R_T1 of the voltage transformer T1.

The voltage transformer T1 may have a predetermined transform ratio based on the number of turns of wires on the primary side and the secondary side. For example, the number of turns of wires on the primary side is referred to as N_primary, and the number of turns of wires on the secondary side is referred to as N_secondary. In this case, the transform ratio of the voltage transformer T1 is determined by N_secondary/N_primary. When the transform ratio is 1, the output voltage Vr_ac=−Vn.

Referring to FIG. 1, when the switch 105 is off, the red wire 141 is in a floating state, therefore the red wire 141 may not be used for detecting a small phantom voltage. However, as discussed above, the neutral wire 142 exhibits a phantom voltage during a switch on or switch off. This phantom voltage that appears on the neutral wire 142 is herein referred to as the voltage V_N_wire. A conventional single-ended sense amplifier may not be adequate for amplifying the phantom voltage because the voltage V_N_wire and the ground of the sensor block 111 may not be connected to each other.

The voltage sense amplifier 312 includes a plurality of amplifiers U1A, U2B, and U3C, and a plurality of resistors R1, R2, and Rg. The amplifiers U1A, U2B, and U3C receives the voltage Vcc of the secondary power source, the battery 316. The voltage sense amplifier 312 receives two input signals Vr_ac and Vn and generates an amplified signal Vo_ac that is amplified from a voltage gap between the two input signals Vr_ac and Vn. The output voltage signal Vo_ac of the voltage sense amplifier 312 is calculated by:

$$Vo\_ac=(Vn-Vr\_ac)*AV,$$

where AV=(1+2R1/Rg*(R2/R1)).

The DC clamp 313 includes a diode D1. The DC clamp 313 cancellate unexpected offset voltage of the voltage sense amplifier 312 using the diode D1. The output of the diode D1 is a direct current (DC) voltage signal Vo_dc.

The ADC 314 receives the voltage output signal from the DC clamp 313. The DC voltage signal Vo_dc output from the ADC 314 is calculated by:

$$Vo\_dc=(2V-Vt\_diode),$$

where Vt_diode is a threshold voltage of the diode D1. To be able to convert the AC voltage input to the DC voltage output, the following condition should be met:

$$Rdc*Cdc>(1/(2*3.14)*f),$$

where f is the frequency of the voltage signal V_N_wire on the neutral wire. When the switch is off, the DC voltage signal Vo_ac is expected to be 2V (assuming that the voltage V_N_wire=20 mV, and the voltage V_ac between the red wire and the neutral wire is 100V).

The voltage comparator 315 includes an amplifier U4 and resistors R9 and R10. The resistor R9 and R10 are serially connected between the voltage Vcc of the battery 316 and a ground. Both the voltage VR_dc that is divided by the resistors R9 and R10 and the DC voltage output Vo_dc from the ADC 314 are fed to the amplifier U4 to generate a sensor voltage Ven_sensor. When the DC voltage signal Vo_dc is greater than VR_dc, the sensor voltage signal Ven_sensor is Vcc. When the DC voltage signal Vo_dc is less than the voltage VR_dc, the sensor voltage signal Ven_sensor is 0V. For example, the voltage VR_dc=1.85 V, when Vcc=3.7 VDC and R9=R10. In other words, when the switch is on or off, the DC voltage signal Vo_dc is greater than VR_dc, therefore the sensor voltage signal Ven_sensor is Vcc. When the power blackout occurs, the DC voltage Vo_dc is less than VR_dc, therefore the sensor voltage signal Ven_sensor becomes 0V.

Figure 4:
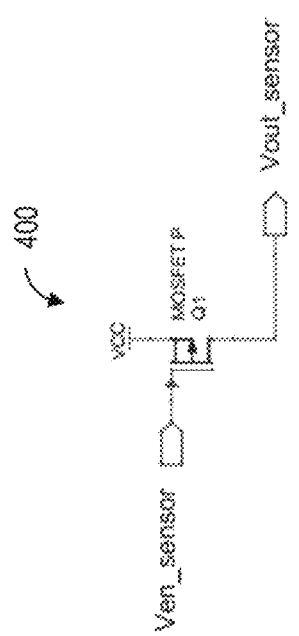
FIG. 4 shows an example power driver block, according to one embodiment.

FIG. 4 shows an example power driver block, according to one embodiment. The power driver block 400 receives the sensor voltage signal Ven_sensor from the power blackout sensing system 300 and generates a sensor output signal Vout_sensor. During a normal switch-on period or a switch-off period, the sensor voltage signal Ven_sensor is Vcc (e.g., 3.7 VDC) of the battery 316 of FIG. 3, and the sensor output signal Vout_sensor is zero. At the power blackout, the sensor voltage signal Ven_sensor is 0V, and the sensor output signal Vout_sensor is the voltage Vcc of the battery 316.

Figure 5:
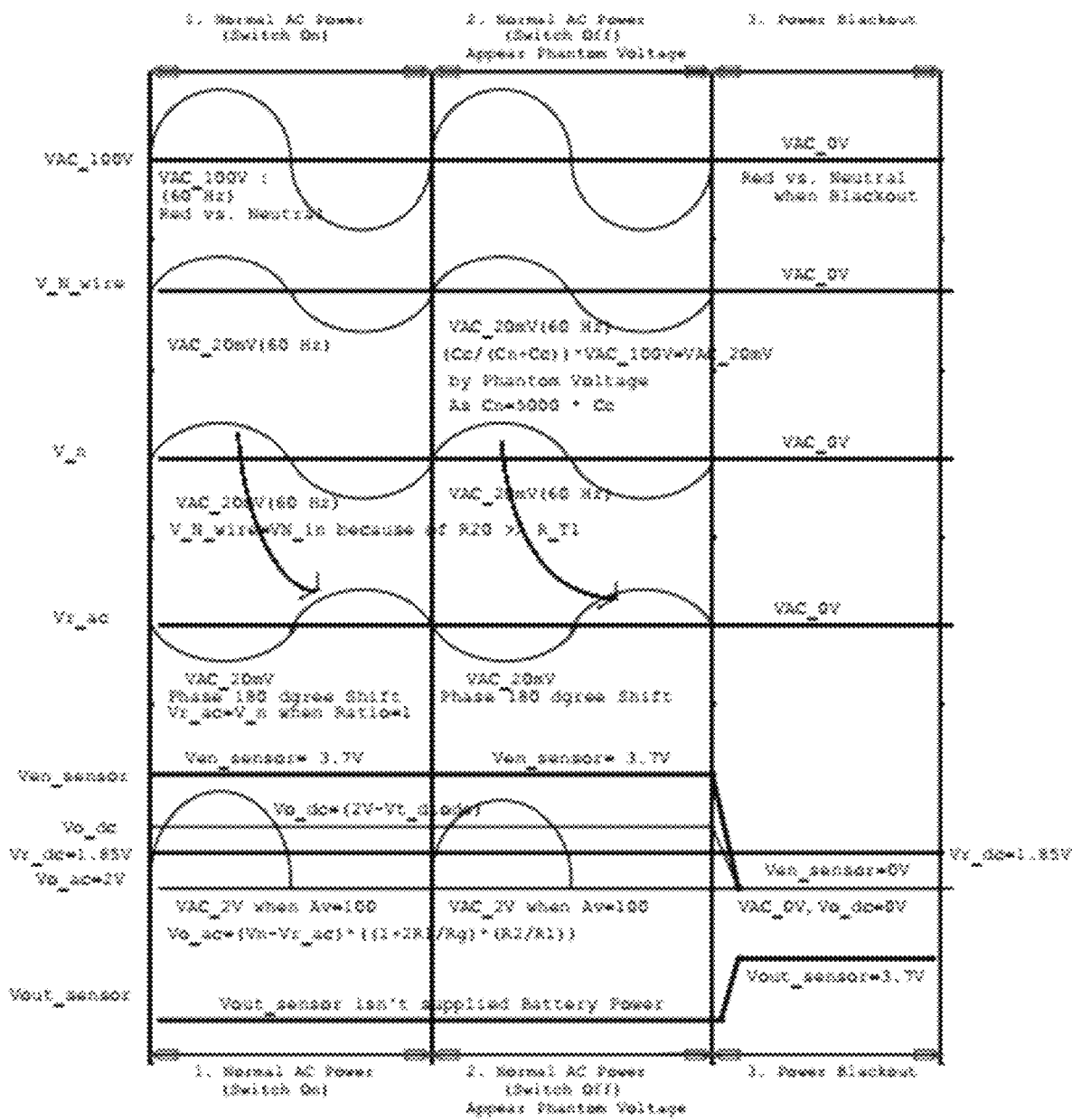
FIG. 5 shows an example timing diagram of waveforms of each power status, according to one embodiment.

FIG. 5 shows an example timing diagram of waveforms of each power status, according to one embodiment. Referring to the equation Eq. 1 above, if Cn is much greater than Cc (e.g., Cn=5,000*Cc), a phantom voltage of 20 mVAC appears as the voltage V_N_wire on the neutral wire when the switch turns on or off. The power driver 400 of FIG. 4 switches off and does not provide the voltage of the battery because the sensor voltage Ven_sensor=Vcc (normal AC power switch on/off using a switch). When a blackout is detected, the power driver 400 switches on, and the DC voltage (e.g., 3.7 VDC) of the battery is output at the sensor output signal Vout_sensor.

Figure 6:
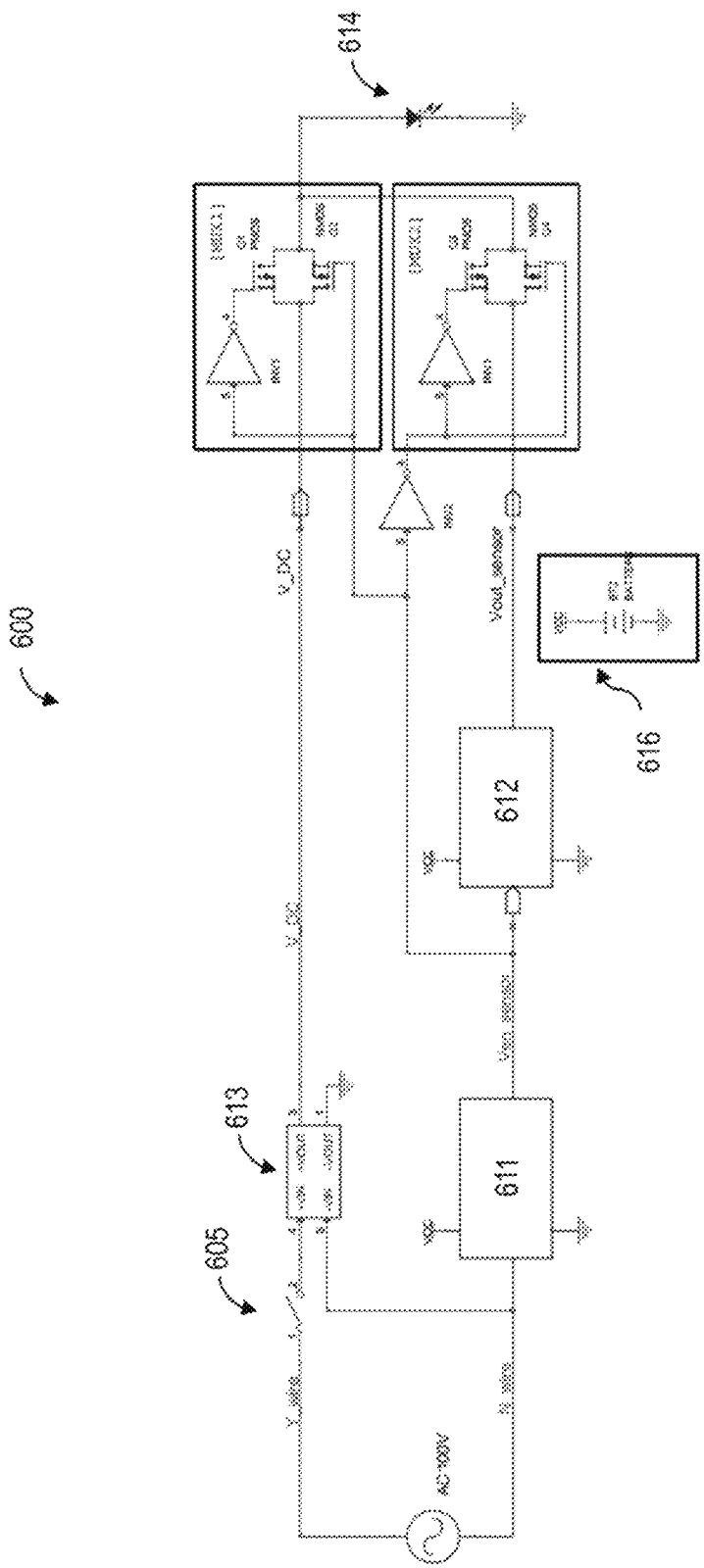
FIG. 6 shows an example power blackout sensing system, according to one embodiment.

FIG. 6 shows an example power blackout sensing system, according to one embodiment. The power blackout sensing system 600 includes a sensor block 611, a power driver block 612, two multiplexers MUX1 and MUX2, a voltage regulator 613, an LED light 614, and a battery 616. The sensor block 611 generates the sensor voltage signal Ven_sensor by sensing a phantom voltage on a wire (e.g., a neutral wire) differently when the power is on/off and a power blackout occurs. The sensor block 611 is connected to the power driver block 612 by a wire connection and controls the power driver block 612 to determine whether to power the LED light 614 using the secondary power of the battery 616.

When the switch 605 is on, the voltage regulator 613 generates a DC voltage V_DC (e.g., 3.7 VDC). Because the switch 605 is turned on, the sensor voltage signal Ven_sensor is output with the voltage of the battery 616 (e.g., 3.7 VDC), and the multiplexer MUX1 is turned on and outputs the DC voltage V_DC to turn on the LED light 614. In this case, the sensor output signal Vout_sensor=0V. When the switch 605 is turned off, the voltage regulator 613 does not output the DC voltage V_DC, therefore the multiplexer MUX1 does not output the DC voltage to power on the LED light 614. In this case, the sensor output signal Vout_sensor=0V, therefore the multiplexer MUX2 is not on, and the LED light 614 is not turned on. When a power blackout occurs, the voltage regulator 613 does not operate (no V_DC), however, the sensor output signal Vout_sensor=Vcc, therefore the second multiplexer MUX 2 is on, and the LED light 614 is powered on using the secondary power (Vcc) from the battery 616.

Figure 7:
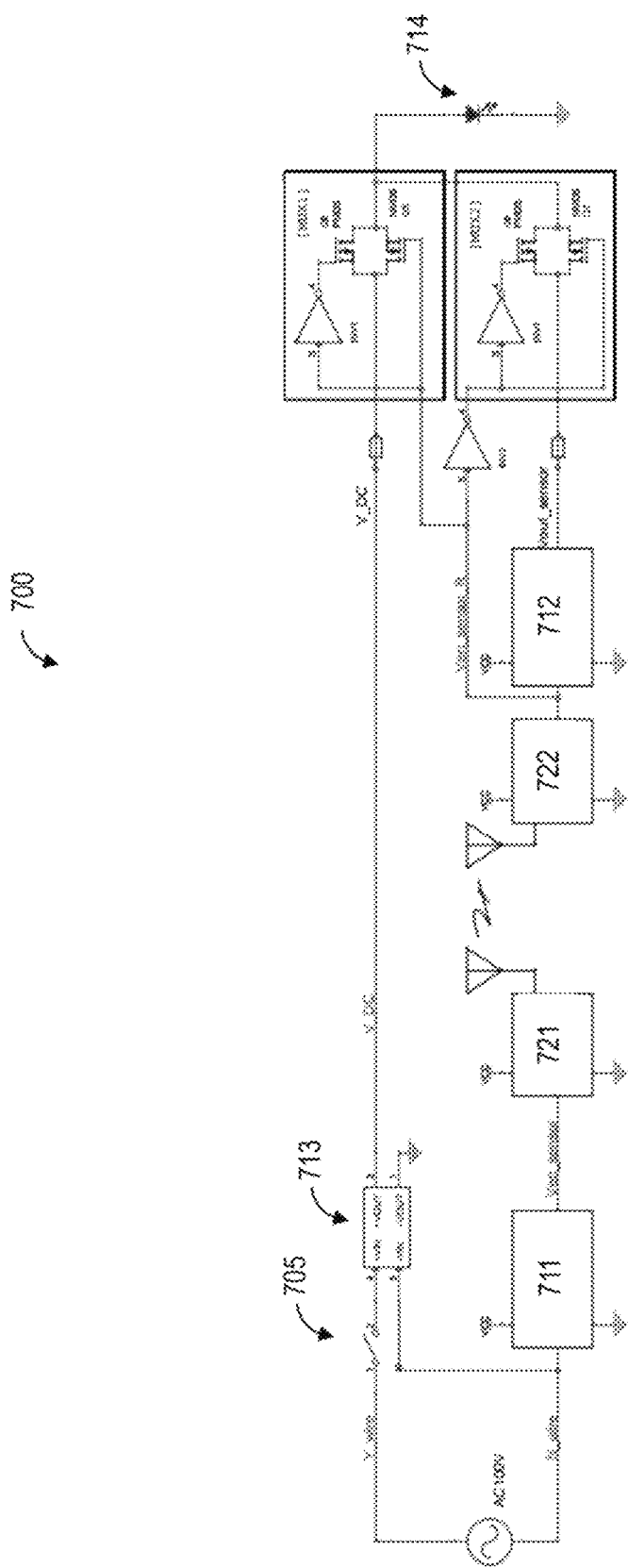
FIG. 7 shows an example power blackout sensing system, according to another embodiment.

FIG. 7 shows an example power blackout sensing system, according to another embodiment. The power blackout sensing system 700 includes a sensor block 711, a power driver block 712, two multiplexers MUX1 and MUX2, a wireless transceiver 721, a wireless receiver 722, a voltage regulator 713, and an LED light 714. The power blackout system 700 is substantially the same as the power blackout system 600 of FIG. 6 except that the sensor block 711 and the power driver block 712 are connected wirelessly via the wireless transceiver 721 and the wireless receiver 722. The sensor voltage signal Ven_sensor is wirelessly transmitted from the wireless transceiver 721 to the wireless receiver 722. The wireless receiver 722 outputs a sensor voltage signal Ven_sensor_R to the power driver block 712 and the multiplexers MUX1 and MUX2. By default, the sensor voltage signal Ven_sensor_R is same as the sensor voltage signal Ven_sensor.

Figure 8:
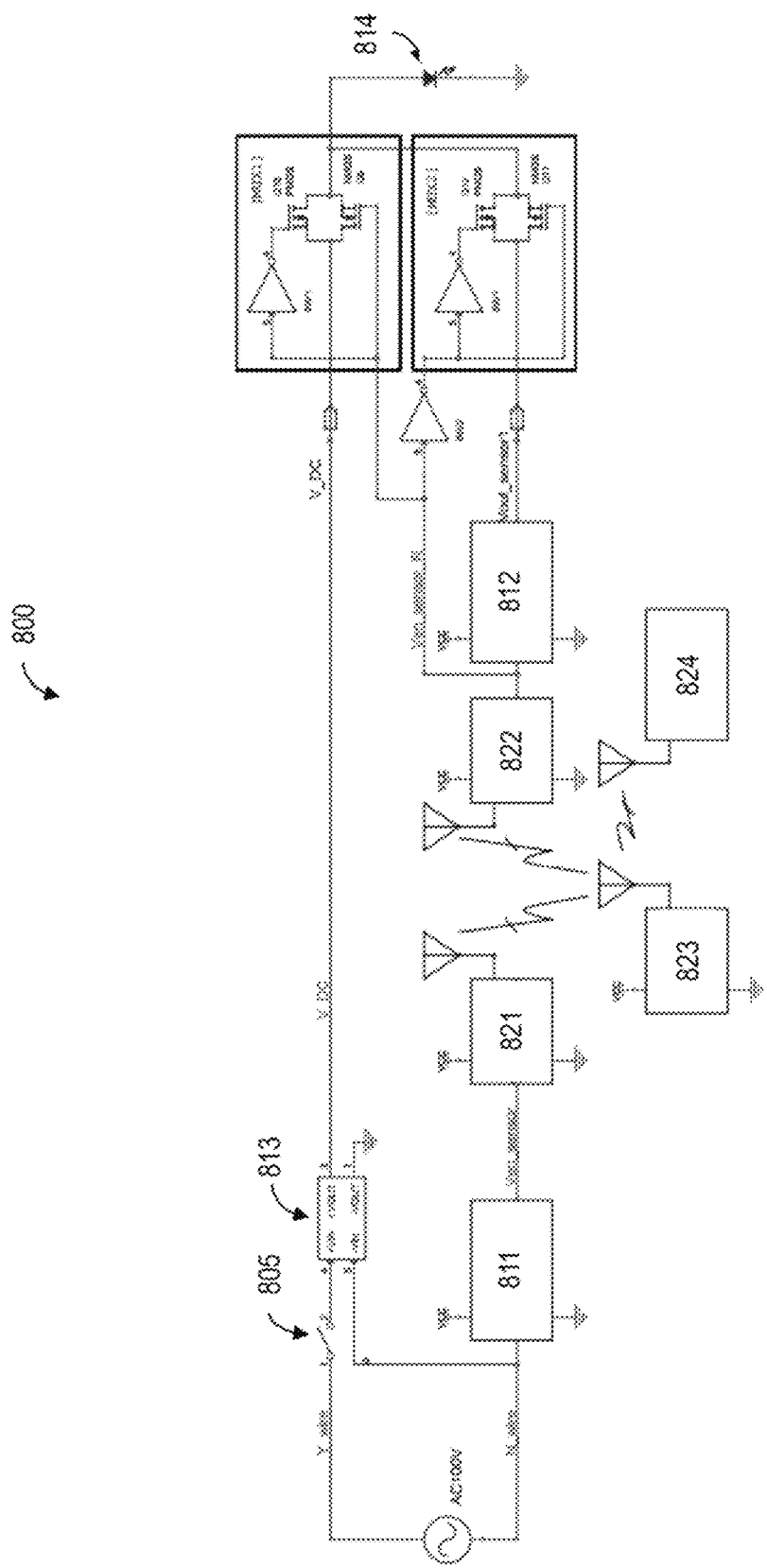
FIG. 8 shows an example power blackout sensing system, according to yet another embodiment.

FIG. 8 shows an example power blackout sensing system, according to yet another embodiment. The power blackout sensing system 800 includes a sensor block 811, a power driver block 812, two multiplexers MUX1 and MUX2, a wireless transceiver 821, a wireless receiver 822, a voltage regulator 813, and an LED light 814. The power blackout system 800 is substantially the same as the power blackout system 700 of FIG. 7 except that the wireless transceiver 821 and the wireless receiver 822 are wirelessly connected to a gateway 823. An external device 824 (e.g., a smartphone or a computer) can connect to the gateway 823 monitor the status of the sensor voltage signal Ven_sensor. The external device 824 can control and change the sensor voltage signal Ven_sensor_R that is output from the wireless receiver 822. For example, the external device 824 can power off the LED light 814 when the switch 813 is on (the LED 814 would be on when the power is on otherwise as discussed above) by setting the sensor voltage signal Ven_sensor_R to zero, and turn on the LED light 814 only during a power blackout period. The external device 824 can report the status of the gateway 823 and the power driver block 812 to a user or a central monitoring agency (e.g., a power company or a security company).

According to one embodiment, a power blackout sensing system includes: a voltage regulator configured to receive one of three phase wires and a neutral wire of a primary power source that provides an alternating current (AC) power; a sensing block configured to receive the neutral wire of the primary power source and comprising a coupled inductor device and a voltage sense amplifier; and a secondary power source. The voltage regulator is coupled to a switch and generates a direct current (DC) voltage signal. The coupled inductor device of the sensing block comprises a pull-down resistor, wherein the coupled inductor device is configured to convert a voltage signal of the neutral wire to a 180-degree phase-shifted voltage signal of the neutral wire and generate a reference voltage signal using the pull-down resistor. The voltage sense amplifier is configured to amplify a voltage gap between the 180-degree phase-shifted voltage signal of the neutral wire and the reference voltage signal. The sensing block detects a phantom voltage on the one of three phase wires and provides an output signal corresponding the secondary power source during a blackout period.

The output signal may correspond to the primary power source during a switch-on period and a switch-off period.

The power blackout sensing system may further include a rectifier configured to rectify the AC power from the primary power source and providing a rectified power to the sensing block.

The power blackout sensing system may further include a DC clamp including a diode. The DC clamp may be configured to cancellate an offset voltage of the voltage sense amplifier.

The power blackout sensing system may further include an AC/DC converter. The sensing block may provide the output voltage corresponding to the secondary power source based on a signal received from the AC/DC converter.

The AC/DC converter may include a capacitor and a resistor.

The power blackout sensing system may further include a voltage comparator that outputs a sensor voltage signal. The sensor voltage signal may be the voltage of the secondary power source during a switch-on period and a switch-off period, and the sensor voltage signal may be zero during the blackout period.

The power blackout sensing system may further include a first multiplexer. The DC voltage signal that is generated by the voltage regulator may be provided to the first multiplexer.

The sensing block may be coupled to a driver. The driver may receive the sensor voltage signal and generate a sensor output signal that powers a device during the blackout period.

The power blackout sensing system may further include a second multiplexer. The sensor output signal generated by the driver may be provided to the second multiplexer.

The sensing block may be integrated in the device.

The device may be one of an emergency light, a high-precision machine, and a medical device.

The sensor block may be coupled to a wireless transceiver and the driver may be coupled to a wireless receiver. The wireless transceiver and the wireless receiver may wirelessly connect the sensor block and the driver.

The wireless transceiver or the wireless receiver may be coupled to an external device via a gateway.

The one of three phase wires may be a red wire, a black wire, or a white wire.

The coupled inductor device may be a voltage transformer or a choke coil.

The above example embodiments have been described hereinabove to illustrate various embodiments of implementing a power blackout sensing system including a phantom voltage detector. Various modifications and departures from the disclosed example embodiments will occur to those having ordinary skill in the art. The subject matter that is intended to be within the scope of the invention is set forth in the following claims.

What is claimed is:
1. A power blackout sensing system comprising:
   a voltage regulator configured to receive one of three phase wires and a neutral wire of a primary power source that provides an alternating current (AC) power;

a sensing block configured to receive the neutral wire of the primary power source and comprising a coupled inductor device and a voltage sense amplifier; and a secondary power source, wherein the voltage regulator is coupled to a switch and generates a direct current (DC) voltage signal, and wherein the coupled inductor device of the sensing block comprises a pull-down resistor, wherein the coupled inductor device is configured to convert a voltage signal of the neutral wire to a 180-degree phase-shifted voltage signal of the neutral wire and generate a reference voltage signal using the pull-down resistor, wherein the voltage sense amplifier is configured to amplify a voltage gap between the 180-degree phase-shifted voltage signal of the neutral wire and the reference voltage signal, and wherein the sensing block detects a phantom voltage on the one of three phase wires and provides an output signal corresponding the secondary power source during a blackout period.

2. The power blackout sensing system of claim 1, wherein the output signal corresponds to the primary power source during a switch-on period and a switch-off period.

3. The power blackout sensing system of claim 1, further comprising a rectifier configured to rectify the AC power from the primary power source and providing a rectified power to the sensing block.

4. The power blackout sensing system of claim 1, further comprising a DC clamp including a diode, wherein the DC clamp is configured to cancellate an offset voltage of the voltage sense amplifier.

5. The power blackout sensing system of claim 4, further comprising an AC/DC converter, wherein the sensing block provides the output voltage corresponding to the secondary power source based on a signal received from the AC/DC converter.

6. The power blackout sensing system of claim 5, wherein the AC/DC converter includes a capacitor and a resistor.

7. The power blackout sensing system of claim 5, further comprising a voltage comparator that outputs a sensor voltage signal, wherein the sensor voltage signal is the voltage of the secondary power source during a switch-on period and a switch-off period, and the sensor voltage signal is zero during the blackout period.

8. The power blackout sensing system of claim 7, further comprising a first multiplexer, wherein the DC voltage signal that is generated by the voltage regulator is provided to the first multiplexer.

9. The power blackout sensing system of claim 8, wherein the sensing block is coupled to a driver, and wherein the driver receives the sensor voltage signal and generates a sensor output signal that powers a device during the blackout period.

10. The power blackout sensing system of claim 9, further comprising a second multiplexer, wherein the sensor output signal generated by the driver is provided to the second multiplexer.

11. The power blackout sensing system of claim 9, wherein the sensing block is integrated in the device.

12. The power blackout sensing system of claim 11, wherein the device is one of an emergency light, a high-precision machine, and a medical device.

13. The power blackout sensing system of claim 9, wherein the sensor block is coupled to a wireless transceiver and the driver is coupled to a wireless receiver, and wherein the wireless transceiver and the wireless receiver wirelessly connect the sensor block and the driver.

14. The power blackout sensing system of claim 13, wherein the wireless transceiver or the wireless receiver is coupled to an external device via a gateway.

15. The power blackout sensing system of claim 1, wherein the one of three phase wires is a red wire, a black wire, or a white wire.

16. The power blackout sensing system of claim 1, wherein the coupled inductor device is a voltage transformer or a choke coil.

* * * * *